United States Patent
Voleti et al.

(10) Patent No.: US 12,222,659 B2
(45) Date of Patent: Feb. 11, 2025

(54) METROLOGY SYSTEM FOR PACKAGING APPLICATIONS

(71) Applicant: Applied Materials, Inc., Santa Clara, CA (US)

(72) Inventors: Venkatakaushik Voleti, San Jose, CA (US); Mehdi Vaez-Iravani, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 194 days.

(21) Appl. No.: 18/098,482

(22) Filed: Jan. 18, 2023

(65) Prior Publication Data
US 2024/0241456 A1    Jul. 18, 2024

(51) Int. Cl.
G03F 9/00    (2006.01)
G03F 7/00    (2006.01)

(52) U.S. Cl.
CPC ........ G03F 9/7088 (2013.01); G03F 7/70775 (2013.01); G03F 9/7069 (2013.01)

(58) Field of Classification Search
CPC ... G03F 7/70775; G03F 9/7069; G03F 9/7088
See application file for complete search history.

(56) References Cited

U.S. PATENT DOCUMENTS

| | | | |
|---|---|---|---|
| 6,137,570 A | 10/2000 | Chuang et al. | |
| 6,972,852 B2 | 12/2005 | Opsal et al. | |
| 7,543,981 B2 | 6/2009 | Timans | |
| 7,659,975 B1 | 2/2010 | Ramani et al. | |
| 8,223,327 B2 | 7/2012 | Chen et al. | |
| 2004/0057044 A1 | 3/2004 | Nikoonahad et al. | |
| 2004/0095573 A1* | 5/2004 | Tsai | G02B 17/0808 356/237.5 |
| 2006/0232785 A1 | 10/2006 | Grasser et al. | |
| 2013/0271750 A1* | 10/2013 | Xu | G03F 9/7088 356/51 |
| 2015/0062553 A1 | 3/2015 | Miyaharu et al. | |
| 2015/0377614 A1 | 12/2015 | Sato | |
| 2022/0020625 A1 | 1/2022 | Volkovich et al. | |
| 2024/0170317 A1* | 5/2024 | Voleti | H01L 21/681 |

FOREIGN PATENT DOCUMENTS

JP    2003-014438 A    1/2003

OTHER PUBLICATIONS

International Search Report for PCT/US2023/035787, dated Feb. 16, 2024.

* cited by examiner

*Primary Examiner* — Peter B Kim
(74) *Attorney, Agent, or Firm* — Moser Taboada (57) ABSTRACT

Methods and apparatus for detecting metrology data are provided herein. For example, an apparatus comprises a substrate support configured to support a substrate and another substrate disposed on the substrate, an incoherent light source configured to transmit an illumination beam through the substrate and the another substrate, a set of optics configured to direct the illumination beam when transmitted through the substrate and the another substrate, an actuator operably coupled to the substrate support and configured to move the substrate and another substrate back and forth in a scanning pattern, and a sensor operably coupled to the actuator, synchronized therewith, and configured to receive the illumination beam from the set of optics to obtain subsurface images of the substrate and the another substrate.

21 Claims, 5 Drawing Sheets

METROLOGY SYSTEM FOR PACKAGING APPLICATIONS

FIELD

Embodiments of the present principles generally relate to semiconductor processing of semiconductor substrates.

BACKGROUND

During semiconductor manufacturing, aligning of masks is typically accomplished by using systems that step to a location, obtain data from that location, and then move on to the next location. The inventors have observed, however, that in packaging applications, thousands of locations may need to be processed on a single substrate, and the step and repeat process may not be fast enough to process the considerable number of locations without a substantial impact on throughput.

For example, an ever-pressing problem in hybrid bonding and packaging applications is the need to ensure precise positioning of bonding pads of two connecting bodies. Although in absolute terms the requirements are not as stringent as requirements needed in usual integrated chip (IC) manufacturing, the issue nevertheless poses a significant problem, since the bonding pads are below the top silicon chip, and, thus, not viewable in the visible light range. Infrared can be used to allow a metrology station to see through and below a chip to expose alignment marks on the substrate on which the chip has been bonded. To achieve any reasonable throughput, alignment metrology for packaging applications requires fast techniques, approaching thousands of measurements per hour.

Accordingly, the inventors have provided methods, apparatus, and systems for alignment metrology conducive to packaging applications.

SUMMARY

Methods and apparatus for alignment metrology conducive to packaging applications are provided herein. For example, in at least some embodiments, an apparatus for detecting metrology data comprises a substrate support configured to support a substrate and another substrate disposed on the substrate, an incoherent light source configured to transmit an illumination beam through the substrate and the another substrate, a set of optics configured to direct the illumination beam when transmitted through the substrate and the another substrate, an actuator operably coupled to the substrate support and configured to move the substrate and another substrate back and forth in a scanning pattern, and a sensor operably coupled to the actuator, synchronized therewith, and configured to receive the illumination beam from the set of optics to obtain subsurface images of the substrate and the another substrate.

In accordance with at least some embodiments a method for packaging applications comprises supporting a substrate and another substrate disposed on the substrate on a substrate support, transmitting an illumination beam through the substrate and the another substrate, directing the illumination beam when transmitted through the substrate and the another substrate, moving the substrate and another substrate back and forth in a scanning pattern, and receiving the illumination beam to obtain subsurface images of the substrate and the another substrate.

In accordance with at least some embodiments a non-transitory computer readable storage medium has instructions stored thereon that when executed by a processor perform a method for packaging applications. The method comprises supporting a substrate and another substrate disposed on the substrate on a substrate support, transmitting an illumination beam through the substrate and the another substrate, directing the illumination beam when transmitted through the substrate and the another substrate, moving the substrate and another substrate back and forth in a scanning pattern, and receiving the illumination beam to obtain subsurface images of the substrate and the another substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods, apparatus, and systems for alignment metrology conducive to packaging applications are provided herein. For example, an apparatus comprises a substrate support configured to support a substrate (e.g., a transparent substrate) and another substrate (e.g., a die/coupon/wafer) disposed on the substrate, an incoherent light source configured to transmit an illumination beam through the substrate and the another substrate, a set of optics configured to direct the illumination beam when transmitted through the substrate and the another substrate, an actuator operably coupled to the substrate support and configured to move the substrate and another substrate back and forth in a scanning pattern, and a sensor operably coupled to the actuator, synchronized therewith, and configured to receive the illumination beam from the set of optics to obtain subsurface images of the substrate and the another substrate. The methods and apparatus described herein overcome the previously described shortcomings associated with conventional methods and apparatus to produce a fast-scanning apparatus that allows metrology data such as bonding alignment data to obtained quickly and efficiently without slowing the packaging processes and substantially impacting yields.

Figure 1:
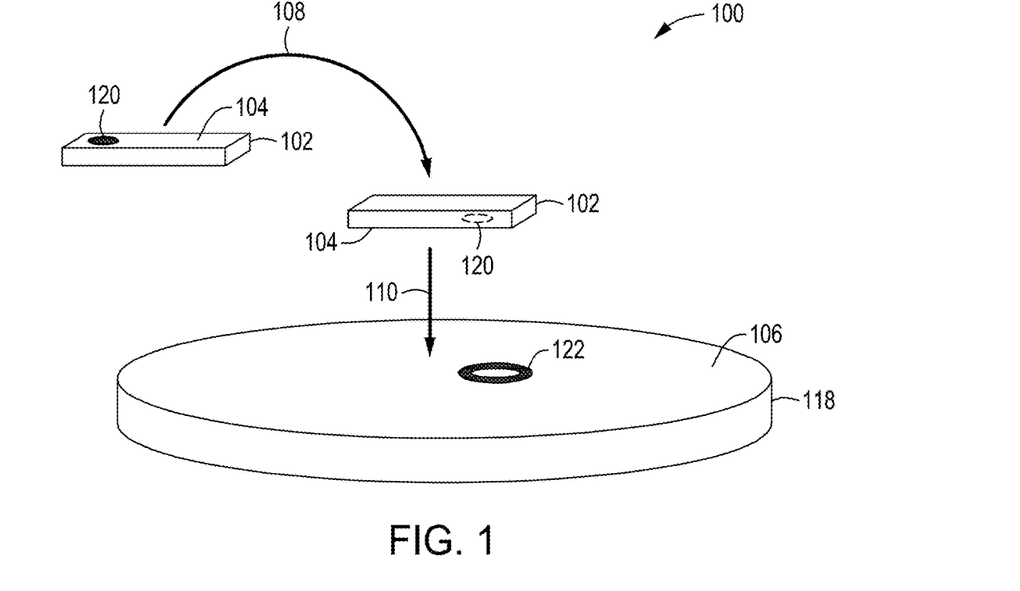
FIG. 1 is a diagram of chips being bonded to a substrate in accordance with at least some embodiments of the present disclosure.

FIG. 1 is a diagram 100 of a first chip 102 being bonded to a substrate 118 in accordance with at least some embodiments of the present disclosure. The first chip 102 can originate from a component substrate (not shown). During hybrid bonding, the first chip 102 can be ejected and picked from the component substrate and flipped 108 upside down such that a top surface 104 of the first chip 102 with a first alignment mark 120 (or fiducial) becomes a bottom surface or chip bonding surface that is bonded to an upper surface 106 or substrate bonding surface of the substrate 118. The upper surface 106 of the substrate 118 can have a second alignment mark 122 that is used to align with the first alignment mark 120 of the first chip 102 during bonding 110.

Figure 2:
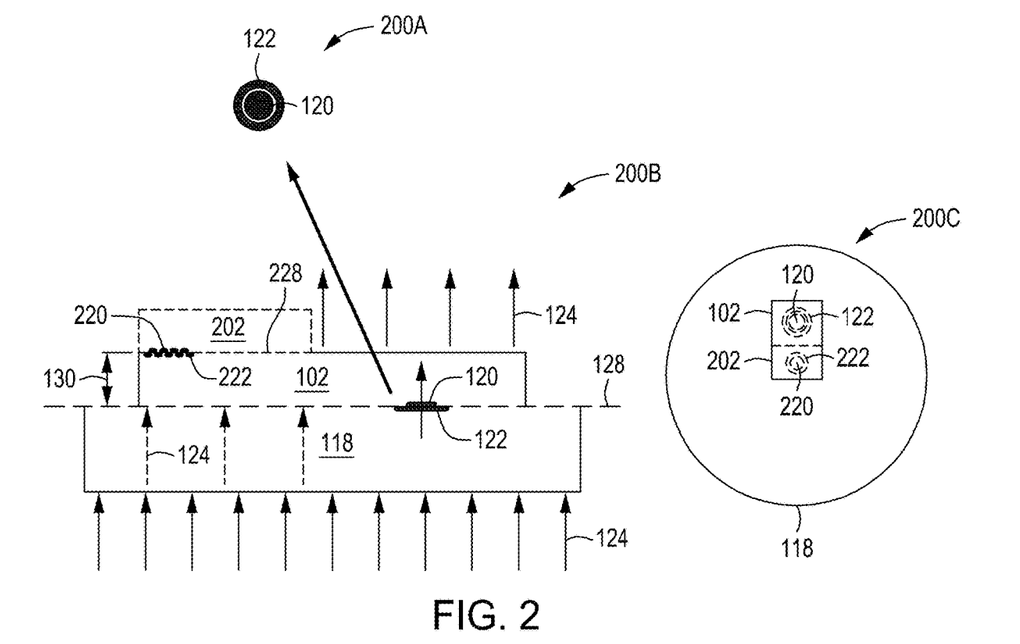
FIG. 2 is a cross-sectional view and top-down view of alignment of chips bonded to a substrate in accordance with at least some embodiments of the present disclosure.

FIG. 2 is a cross-sectional view 200B and a top-down view 200A of aligned fiducial marks and a top-down view 200C of the first chip 102 bonded to the substrate 118 in accordance with at least some embodiments of the present disclosure. For the examples depicted in FIGS. 1 and 2 and not meant to be limiting, the first alignment mark 120 on the first chip 102 is a circle and the second alignment mark 122 on the substrate 118 is a ring. For the example, a proper alignment is when the circle of the first alignment mark 120 is centered within the ring of the second alignment mark 122 of the substrate 118 as depicted in top-down view 200A and top-down view 200C. When the first chip 102 is bonded to the substrate 118, the first alignment mark 120 and the second alignment mark 122 are essentially co-planar along plane 128 as depicted in the cross-sectional view 200B.

To determine if proper alignment of the first chip 102 and the substrate 118 has been accomplished after bonding, an illumination beam 124 is set to penetrate through the substrate 118, the bonding surface of the first chip 102 near the upper surface 106 at plane 128, and the first chip 102 (e.g., a depth 130). The illumination beam 124 is then captured by a detector (not shown, see FIG. 4) which processes a set of image data from the illumination beam 124. The detector or an associated image analyzer (e.g., the alignment correlator 446 of FIG. 4) compares the image data of the first alignment mark 120 of the first chip 102 to the second alignment mark 122 of the substrate 118 and determines if an alignment error has occurred. The image data may also be compared to historical image/alignment error data to determine an overall alignment error including rotational errors (angle alignment error caused by rotational skewing of the bonded chip relative to the substrate, see, e.g., FIG. 3, top-down view 300C).

Some packaging processes have stacked chips which require multi-planar subsurface imaging which presents unique challenges. For example, the system should be capable of imaging at multiple depths or focal points as needed. In some embodiments, an optional second chip 202 may be bonded to the first chip 102 as depicted in FIG. 2. A fourth alignment mark 222 of the optional second chip 202 is used to align with a third alignment mark 220 of the first chip 102 during bonding 110. For the example depicted in FIG. 2 and not meant to be limiting, the third alignment mark 220 on the optional second chip 202 is a circle and the fourth alignment mark 222 on the first chip 102 is a ring. For the example, a proper alignment is when the circle of the third alignment mark 220 is centered within the ring of the fourth alignment mark 222 of the first chip similar to the top-down view 200A and as depicted in the top-down view 200C. When the optional second chip 202 is bonded to the first chip 102, the third alignment mark 220 and the fourth alignment mark 222 are essentially co-planar at the interface 228 of the bonded surfaces of the chips as depicted in the cross-sectional view 200B.

To determine if proper alignment of the first chip 102 and the second chip 202 has been accomplished after bonding, the illumination beam 124 is set to penetrate through the optional second chip 202 and is then captured by a detector (not shown, see FIG. 4) which processes a set of image data from the illumination beam 124. The detector or an associated image analyzer (e.g., the alignment correlator 446 of FIG. 4) compares the image data of the third alignment mark 220 of the optional second chip 202 to the fourth alignment mark 222 of the first chip 102 and determines if an alignment error has occurred. The image data may also be compared to historical image/alignment error data to determine an overall alignment error including rotational errors (angle alignment error caused by rotational skewing of the bonded chip relative to the substrate, see, e.g., FIG. 3, top-down view 300C).

In more complex packaging processes, bonded single chips and bonded stacked chips may require multi-planar subsurface imaging to obtain fiducial alignment images as the fiducial alignment pairs may be located at different planes. In a cross-sectional view 300A of FIG. 3, a first chip 304 has been bonded to a substrate 302. The substrate 302 has fiducials or a first set of alignment marks 308 on a first surface 310. The first chip 304 has a second set of alignment marks 312 on a second surface 314 that are meant to align the first chip 304 to the substrate 302. To determine if proper alignment of the first chip 304 and the substrate 302 has been accomplished after bonding, the illumination beam 124 is set to penetrate through the substrate 302 near the first surface 310, and the first chip 304 (e.g., a first depth 318). The illumination beam 124 is then captured by a detector (not shown, see FIG. 4) which processes a first set of image data from the illumination beam 124. The detector or an associated image analyzer (e.g., the alignment correlator 446 of FIG. 4) compares the sets of image data and determines if an alignment error has occurred. The image data may also be compared to the image/alignment error data to determine an overall alignment error including rotational errors (angle alignment error caused by rotational skewing of the bonded chip).

Figure 3:
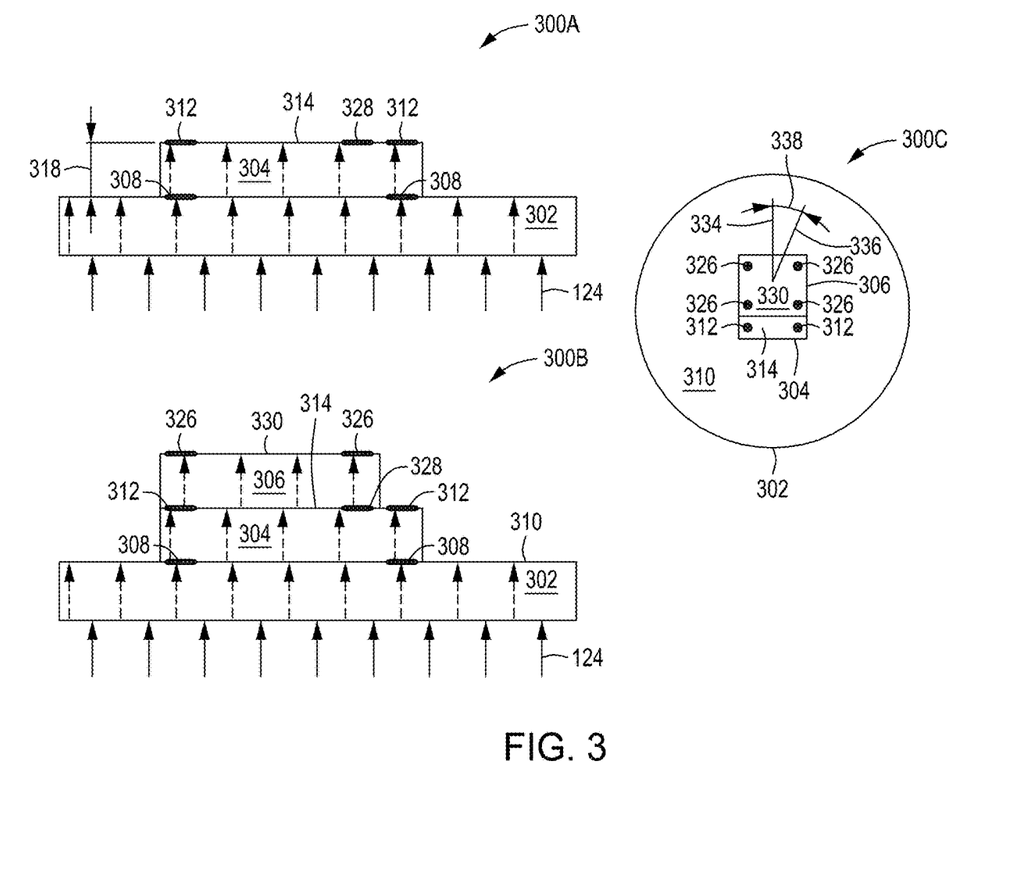
FIG. 3 is a cross-sectional view and a top-down view of alignment of chips bonded to a substrate in accordance with at least some embodiments of the present disclosure.

In a cross-sectional view 300B of FIG. 3, a second chip 306 has been bonded to the first chip 304. The second chip 306 has a third set of alignment marks 326 on a third surface 330 of the second chip 306 that are meant to align the second chip 306 to the first chip 304. The third set of alignment marks 326 align with a fourth set of alignment marks 328 on the second surface 314 of the first chip 304 and also one or more of the marks of the second set of alignment marks 312 on the second surface 314 of the first chip 304. In cases where alignment overlap occurs in multiple bonding stacks, prior image data can be used to compare with newly acquired image data at a different depth. The image data from each of the surfaces of the substrate 302, the first chip 304, and second chip 306 can be compared without requiring repeating of the illumination beams at the different depth levels (focal points).

In a top-down view 300C of FIG. 3, the substrate 302 is depicted with the first chip 304 bonded to the substrate 302 and the second chip 306 bonded to the first chip 304. On the third surface 330 of the second chip 306, the third set of alignment marks 326 are visible. On the second surface 314 of the first chip 304, a portion of the second set of alignment marks 312 are visible. As an example, a desired orientation line 334 for the second chip 306 is used to compare with an actual (skewed) orientation line 336 with an error angle 338. The error angle 338 indicates positive or negative rotation from the desired orientation. Thus, both alignment errors and orientation errors can be determined from the image data obtained from the alignment marks. The illumination source must be able to penetrate through silicon materials while being fast focus adjustable to allow multiple focal points at different depths. In some circumstances, thousands of locations on the substrate 302 are required to be scanned in a timely manner. Despite the challenges presented, the inventors have overcome the obstacles to produce a fast-scanning apparatus that allows metrology data such as bonding alignment data to obtained quickly and efficiently without slowing the packaging processes and substantially impacting yields.

Figure 4:
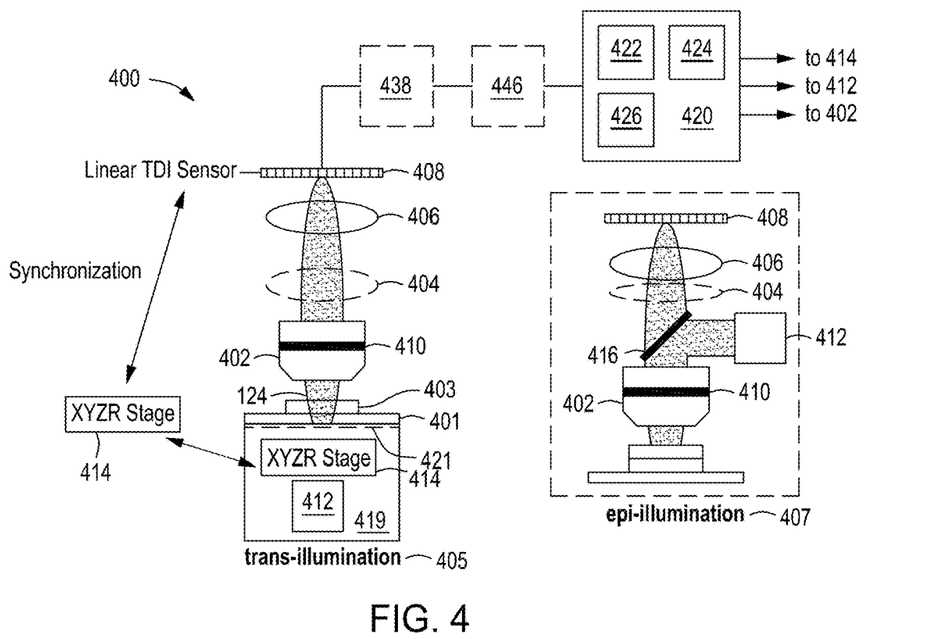
FIG. 4 is a diagram of a metrology system in accordance with at least some embodiments of the present disclosure.

FIG. 4 is a diagram of a metrology system 400 in accordance with at least some embodiments of the present disclosure. For example, the metrology system 400 comprises three (3) sub-modules, a detection submodule, an illumination submodule, and a motion submodule. The metrology system 400 is operable in a trans-illumination mode of operation 405 and epi-illumination mode of operation 407.

For example, in the trans-illumination mode of operation 405, the detection submodule comprises a set of optics comprising at least one of a high-magnification microscope 402 (e.g., ranging in magnifications from about 10× to about 100×) comprising an autofocus lens 404 (e.g., beam forming optics), a single resolution lens 410 or a tube lens 406, and a multi-stage SWIR (short wave infrared) TDI (time-delay integration) sensor 408 (e.g., a linear sensor, camera). In at least some embodiments, the autofocus lens 404 can comprise a high-speed electrically tunable or acousto-optically modulated lens that can focus at multiple depths (e.g., kilohertz rates, a laser-based actively focused module, or image-contrast based passive autofocus module). In at least some embodiments, the single resolution lens 410 can be a high-resolution lens.

Given the line-rates at which the multi-stage SWIR TDI sensor 408 can operate (about 10's—of Hz to about 100's of kHz, e.g., 10 Hz to about 900 kHz), resultant small exposure times can leave the multi-stage SWIR TDI sensor 408 light-starved without adequate amounts of light at the sample (e.g., substrate (wafer)-coupon). Accordingly, a key challenge is to manage a trade-off between illumination light intensity, etendue, and coherence. Compared to known methods and apparatus that use a laser for an illumination beam, the methods and apparatus described herein use an incoherent light source 412 (e.g., an LED or alternative light source) which obviates the need to speckle-bust. For example, light in the SWIR wavelength range can pass entirely through a substrate 401 (silicon, geranium, etc., wafer)-coupon (403) package and can, therefore, be used in the trans-illumination mode of operation 405. In the trans-illumination mode of operation 405, the incoherent light source 412 is positioned adjacent to the under-side/bottom-side of the substrate (wafer), significantly improving the efficiency of an optical path from the incoherent light source 412 to the sample (e.g., an area that is being scanned on the substrate). For example, in the trans-illumination mode of operation 405, the substrate 401 (wafer) can rest upon a transparent surface 421 that is disposed on a substrate support 419 and configured to support the substrate 401, and an X-Y-Z-R stage 414 (e.g., an actuator or scanner) can be operably coupled to the incoherent light source 412 (e.g., to permit under-side access across the substrate 401 (e.g., the entire substrate). For example, in at least some embodiments, the incoherent light source 412 and the X-Y-Z-R stage 414 can be disposed in the substrate support 419 (positioned in the substrate support 419) beneath the transparent surface 421 on which the substrate 401 can be positioned. In at least some embodiments the incoherent light source 412 can be positioned below the X-Y-Z-R stage 414. Alternatively, the incoherent light source 412 can be positioned above the X-Y-Z-R stage 414. During operation, the incoherent light source 412 and the X-Y-Z-R stage 414 remain relatively stationary while the X-Y-Z-R stage 414 moves the transparent surface 421 of the substrate support 419 along the x-direction and the y-direction. In at least some embodiments, the X-Y-Z-R stage 414 can also move the transparent surface 421 of the substrate support 419 along the z-direction and can rotate the substrate support 419 (e.g., the r-direction).

For advanced packaging, however, involving bonding of multiple coupons one-upon-another (e.g., in memory applications) and atop the substrate 401, non-transparent features such as copper pads and wiring from lower-level coupons may block the transmission of light delivered via the trans-illumination mode of operation. Accordingly, in at least some embodiments, the epi-illumination mode of operation 407 can be used to deliver light directly to a top-side of the multiple coupons and/or the substrate. In such embodiments, the incoherent light source 412 can be positioned between the high-magnification microscope 402 and the multi-stage SWIR TDI sensor 408 and one or more optical components 416 (e.g., at least one of beam splitters, reflectors, polarizers, etc., which can be a component of the high-magnification microscope 402) can be used to direct the illumination beam from the incoherent light source 412 to the top-side of the multiple coupons and/or the substrate. In at least some embodiments, the incoherent light source 412 can be disposed/positioned on a platform (not shown) adjacent to the substrate support 419. Alternatively, the incoherent light source 412 can be disposed/positioned on an inner wall of a processing chamber. A reflected illumination beam can be reflected from the multiple coupons and/or the substrate back to the multi-stage SWIR TDI sensor 408 via the one or more optical components 416.

Depending on system configuration, over 50-75% of light transmitted from the incoherent light source 412 can be lost in the coupling of the illumination submodule to the rest of the optical system. In at least some embodiments, a single sufficiently bright incoherent light source in the SWIR range may render the level of light-loss insignificant. However, in other embodiments, a single light source may not be sufficiently bright. In the latter case, a multi-spectral incoherent light source comprising many spectral channels (e.g., a light source with a broader range of optical wavelengths) that fills the multi-stage SWIR TDI sensor's quantum efficiency (QE) band may also be used to address the shortfall in light intensity. Accordingly, in at least some embodiments, multiple incoherent light sources and/or multi-spectral incoherent light sources may be used simultaneously to increase throughput by using different wavelengths uniformly along the entire sample (e.g., substrate). For example, in such embodiments, the multiple incoherent light sources and/or multi-spectral incoherent light sources can produce multiple corresponding illumination beams that travel a similar path as the illumination beam 124 except directed along a substrate of, for example, a stacked chip and the like. For example, in at least some embodiments, such as when a multi-stage SWIR TDI sensor can detect across a range of wavelengths (e.g., from about 1300 nm to about 1700 nm) and a light source can emit over a very broad range of wavelengths (e.g., from about 1300 nm to about 1700 nm), but the light source is not bright enough, the light source can be replaced with a series of narrower band light sources, which in aggregate can deliver more power to the sample. For example, a light source one can emit at from about 1410 nm to about 1430 nm, but isn't bright enough, then a light source two can be added in another wavelength band (e.g., to emit from about 1510 nm to about 1530 nm), a light source 3 be added in another wavelength band (e.g., to emit from about 1630 nm to about 1650 nm, and so on to add to the needed brightness.

Figure 5:
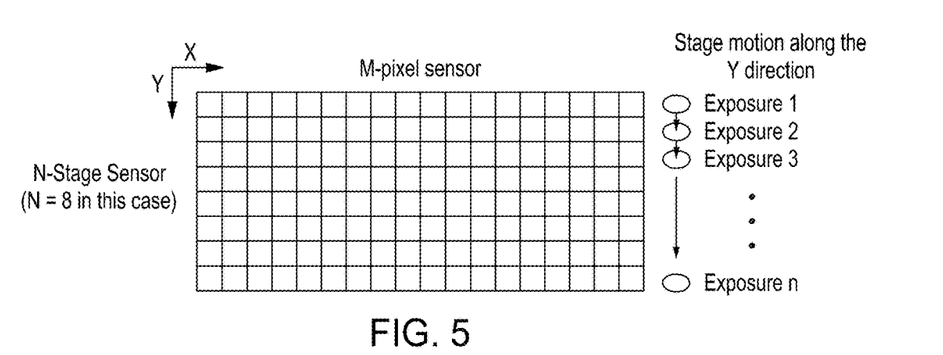
FIG. 5 is a diagram illustrating synchronization of a sensor and an actuator in accordance with at least some embodiments of the present disclosure.
Figure 6:
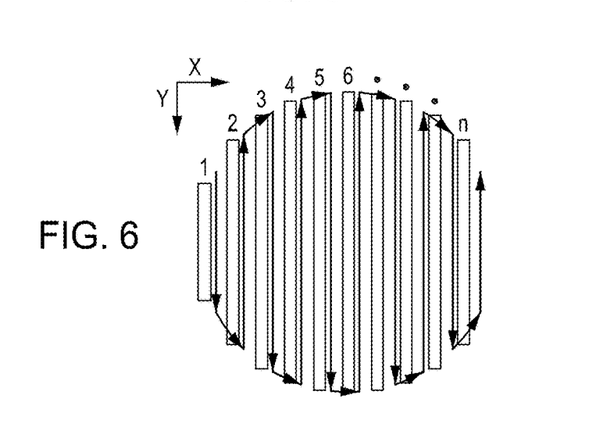
FIG. 6 is a diagram of a full substrate scan pattern in accordance with at least some embodiments of the present disclosure.

The motion submodule consists of the X-Y-Z-R stage 414 which can be synchronized (shown by synchronization arrows) with the multi-stage SWIR TDI sensor 408 read-out rate. The X-Y-Z-R stage 414 can move the incoherent light source 412 along multiple paths. For example, in at least some embodiments, the X-Y-Z-R stage 414 can move the incoherent light source 412 along the Y-direction at a speed such that a specific target (area along the substrate (wafer)-coupon) is exposed multiple times by each successive stage (e.g., line) of the multi-stage SWIR TDI sensor 408. Thus, in at least some embodiments, by averaging each exposure (either in analog mode through charge accumulation or digitally after the multi-stage SWIR TDI sensor 408 read-out), the substrate 401 can be scanned continuously at high speeds without sacrificing signal to noise ratio, SNR. For example, FIGS. 5 and 6 show how full-substrate (wafer) mapping can be accomplished by scanning multiple strips across the Y-direction (e.g., 1, 2, 3, 4, 5, 6, . . . , nth), and stepping across the X-direction in a relatively serpentine fashion. For example, the X-Y-Z-R stage 414 is configured to move the substrate support including the substrate, which includes the sample on top of it. The multi-stage SWIR TDI sensor 408 and incoherent light source 412 remain stationary. In at least some embodiments, multi-stage SWIR TDI sensor 408 can be configured with 128 stages of integration, e.g., N=128 and 1024 columns, e.g., M=1024.

Alternatively or additionally, if full-substrate coverage is not required, selected targets can be pre-defined ahead of image acquisition and the stage can be directed only at specific locations.

During illumination of a target location on a substrate with the illumination beam 124, the illumination beam 124 is used to form image data. For example, the illumination beam 124 is directed to and received by the multi-stage SWIR TDI sensor 408. The multi-stage SWIR TDI sensor 408 receives the illumination beam 124 and generates an image. For example, the illumination beam 124 may operate in conjunction with a store 438 where the images can be stored in a memory and recalled for later alignment comparisons and/or in conjunction with an alignment correlator 446 that receives multiple images from the multi-stage SWIR TDI sensor 408 and uses image overlay processes to determine alignment error locations and alignment error values (e.g., alignment shift, alignment rotational errors, etc.). In some embodiments, images are made by the multi-stage SWIR TDI sensor 408 by taking greater than the Nyquist number of samples per point spread function (PSF), to render the alignment statistics independent of the precise location of any target. Thus, when assembled, the images of the targets are identical (in terms of information the images convey) to any non-scanning images obtained (such as images taken with a digital camera). The algorithmic strategies employed to perform measurements on the images (such as by the alignment correlator 446) can, therefore, use similar algorithmic strategies used for still images.

A controller 420 may be used to enable data collection and feedback from the respective apparatus of the metrology system 400 to optimize performance of the metrology system 400 as well as control of the system apparatus (e.g., scanning patterns, scanning control, scanning locations, etc.). The controller 420 generally includes a CPU 422 (Central Processing Unit), a memory 424 (non-transitory computer readable storage medium), and a support circuit 426. The CPU 422 may be any form of a general-purpose computer processor that can be used in an industrial setting. The support circuit 426 is conventionally coupled to the CPU 422 and may comprise a cache, clock circuits, input/output subsystems, power supplies, and the like. Software routines, such as a method for controlling the metrology system 400 as described above may be stored in the memory 424 and, when executed by the CPU 422, transform the CPU 422 into a specific purpose computer (the controller 420). The software routines may also be stored and/or executed by a second controller (not shown) that is located remotely from the metrology system 400.

In at least some embodiments, the controller 420 may be in operable communication with the incoherent light source 412 to alter the illumination wavelength and/or power and the like, high-magnification microscope 402 to shape the illumination beam 124, the X-Y-Z-R stage 414 to increase or decrease a scanning rate and/or a scanning width, and the multi-stage SWIR TDI sensor 408 to generate high-resolution images by altering algorithm types and the like.

For hybrid bonding applications, precision positioning of the pixels in the obtained images is particularly important. Accordingly, the controller 420 enables control over the incoherent light source for illuminating an entire field of view simultaneously and controls the X-Y-Z-R stage 414 to move the substrate through the field of view. The controller 420 may also be in operable communication with the store 438 and/or the alignment correlator 446 to further enhance the metrology data gathering process. The controller 420 may also be in operable communication with an actuator (not shown) of a substrate support (not shown) to enable X direction and Y direction movement to produce scanning swaths. The controller 420 may also alter the scanning locations on the substrate/chip as required by commanding the actuator to move to various locations. The controller 420 may also communicate with the X-Y-Z-R stage 414 and the actuator in concert to enable a desired scanning pattern and the like. One skilled in the art will understand that other ancillary apparatus (e.g., additional optics, power sources, etc.) may be used in conjunction with the metrology system 400, and the controller 420 may also be in communication with the ancillary apparatus.

The data from the metrology system 400 can be analyzed in two stages. For example, in a first stage raw data can be converted into overlay misalignment values and the misalignment values can be related to other parameters within the bonding tool. For example, the raw data generated by the metrology system 400 can be configured to take the form of strips along the X-Y plane and imaged as described above.

The X-extent of a single strip is determined by a length of the multi-stage SWIR TDI sensor 408, and magnification of an optical system (e.g., illumination submodule). The Y-extent of the strip is determined by a range of stage scanning along the Y-direction. Detection of overlay targets within the strips can be performed via commonly used machine vision techniques (e.g., fiducial matching and image registration, as described above), which will allow a user to rapidly quantify misalignment between the substrate (wafer) and coupon at specific locations on the substrate (wafer). In the second stage, the extracted overlay measurements can then be related to various process tool parameters. For example, a poor parameter selection in an upstream wet-clean step may manifest as greater misalignment of coupons towards the edge. As another example, location-dependent misalignment can correlate to pressure profiles used during the bonding step. Machine learning can be used in the context of an integrated packaging tool with on-board metrology capabilities capable to establish the parameter relationships.

Figure 7:
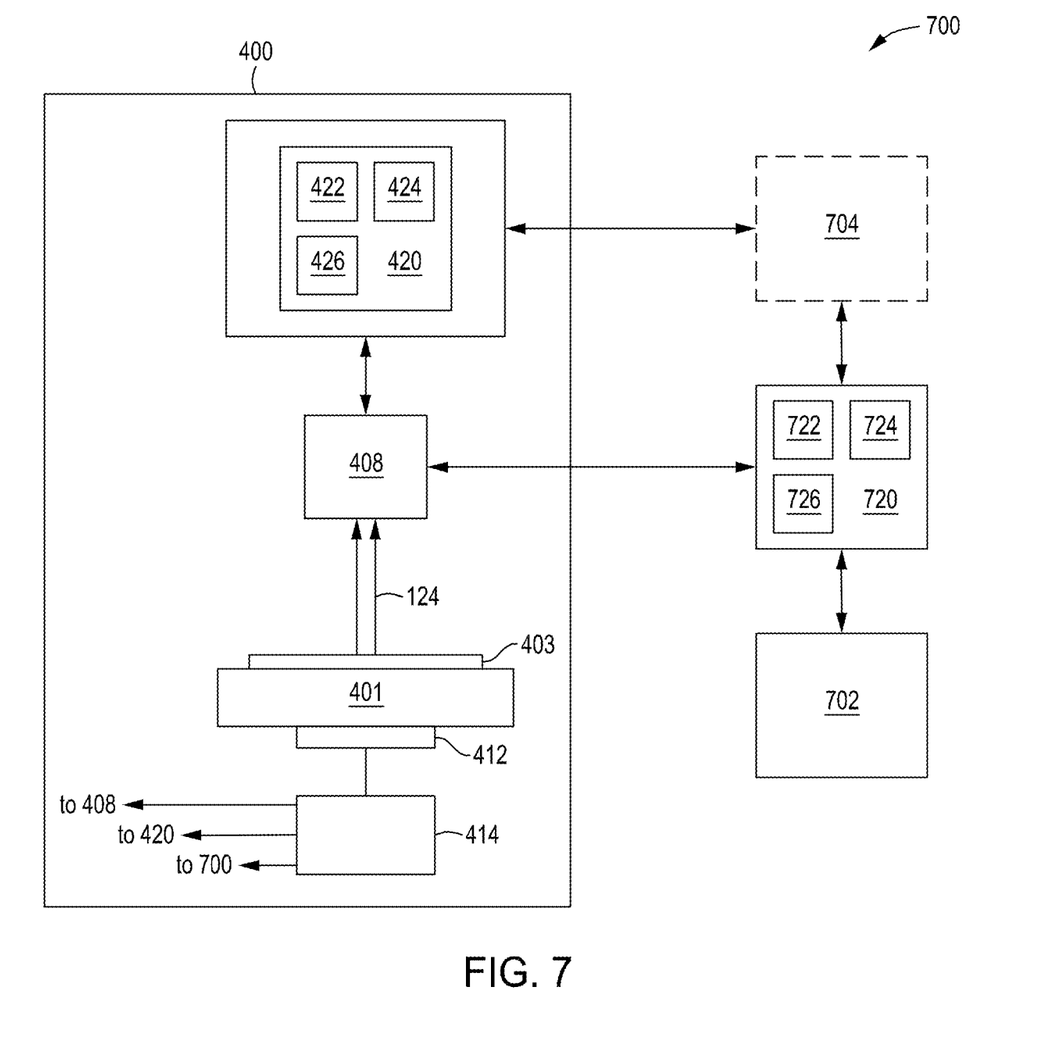
FIG. 7 is a diagram of a metrology system in communication with a hybrid bonder to enable alignment feedback in accordance with at least some embodiments of the present disclosure.

The metrology system 400 may be used in conjunction with a hybrid bonder 702 to improve the hybrid bonding alignment process as depicted in a view 700 of FIG. 7. The hybrid bonder 702 is typically controlled by a controller 720. The controller 720 may be used to enable data collection and feedback/feedforward from the controller 420 of the metrology system 400 to optimize performance of the hybrid bonder 702. The controller 720 generally includes a CPU 722 (Central Processing Unit), a memory 724, and a support circuit 726. The CPU 722 may be any form of a general-purpose computer processor that can be used in an industrial setting. The support circuit 726 is conventionally coupled to the CPU 722 and may comprise a cache, clock circuits, input/output subsystems, power supplies, and the like. Software routines, such as a method for controlling the alignment of bonding substrates and/or chips may be stored in the memory 724 and, when executed by the CPU 722, transform the CPU 722 into a specific purpose computer (e.g., the controller 720). The software routines may also be stored and/or executed by a fourth controller (not shown) that is located remotely from the hybrid bonder 702.

In some embodiments, the metrology system 400 may directly communicate with the controller 720 to relay alignment information to the hybrid bonder 702 such that subsequent bonding processes have improved alignment errors. The feedback/feedforward from the metrology system 400 may be in real-time or at scheduled intervals. In some embodiments, the alignment correlator 446 of the metrology system 400 may transmit actual alignment error data and values such as, but not limited to, alignment offsets for each fiducial and/or an angular rotation error value for a given type of chip and/or the location of the chip or chips. To facilitate in enhancing the value of the alignment information, the metrology system 400 may incorporate machine learning to augment the image data processing in, for example, but not limited to, the multi-stage SWIR TDI sensor 408, the alignment correlator 446, and/or the controller 420. In some embodiments, an alignment image data processor 704 may be used along with machine learning to interpret the alignment information and/or data information from the metrology system 400 in order to correlate the alignment errors to changes required in the hybrid bonder 702 to reduce or eliminate subsequent bonding alignment errors. As such, for example but not limited to, the machine learning may account for alignment shift data, alignment rotational errors, and the like and determine, for example but not limited, the capabilities of the hybrid bonder 702 to reduce/eliminate the errors. For example, the machine learning may account for the hybrid bonder's application pressure, amount of vacuum used to pick up the chips, and/or tolerances of the mechanical apparatus used to position a chip on a substrate and the like in order to decrease alignment errors by the hybrid bonder.

Figure 8:
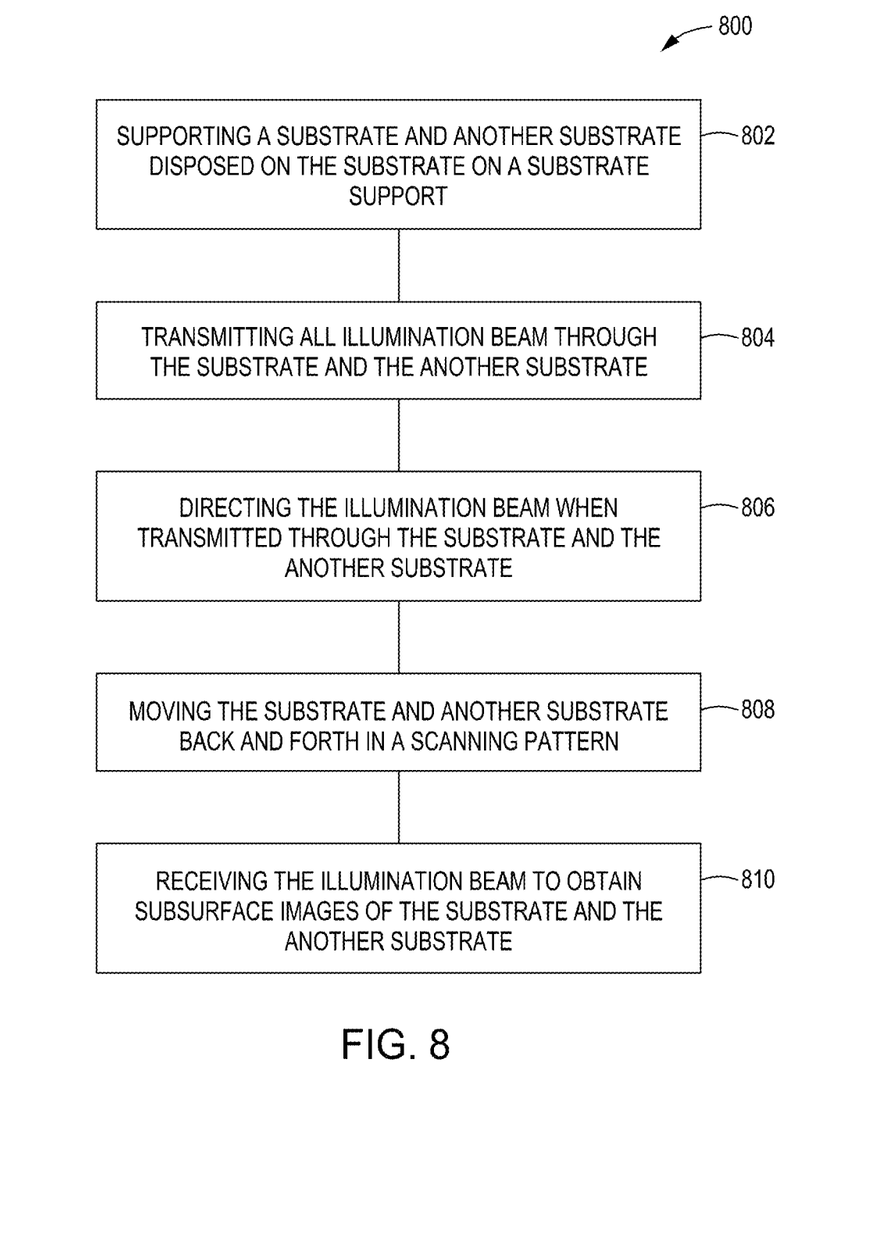
FIG. 8 is a flowchart of a method for packaging applications in accordance with at least some embodiments of the present disclosure.

FIG. 8 is a flowchart of a method 800 for packaging applications in accordance with at least some embodiments of the present disclosure. For illustrative purposes, the method 800, performed under control of the controller 420, is described in terms of use with the metrology system 400.

For example, at 802, the method 800 comprises supporting a substrate and another substrate disposed on the substrate on a substrate support. For example, the substrate 401 and at least one of a coupon, wafer, or die supported on the substrate can be supported on the transparent surface 421 of the substrate support 419.

Next, at 804, the method 800 comprises transmitting an illumination beam through the substrate and the another substrate. For example, as noted above, the incoherent light source 412 can be configured to transmit the illumination beam 124 through the substrate 401 and the another substrate. In at least some embodiments, such as when the incoherent light source 412 is positioned beneath the transparent surface 421 (trans-illumination mode of operation 405), the transparent surface 421 can be configured to deliver the illumination beam from a bottom-side of the substrate and through the substrate 401 and the another substrate. Alternatively, in at least some embodiments, such as when the incoherent light source 412 is positioned between the set of optics and the multi-stage SWIR TDI sensor 408, the incoherent light source 412 can be configured to deliver light directly to a top-side of the substrate 401 and the another substrate (epi-illumination mode of operation 407).

Next, at 806, the method 800 comprises directing the illumination beam when transmitted through the substrate and the another substrate. For example, the set of optics comprising at least one of the high-magnification microscope 402, the autofocus lens 404, the single resolution lens 410, or the tube lens 406 can be configured to direct the illumination beam when transmitted through the substrate 401 and the another substrate.

Next, at 808, the method 800 comprises moving the substrate and another substrate back and forth in a scanning pattern, and at 810, the method 800 comprises receiving the illumination beam to obtain subsurface images of the substrate and the another substrate.

For example, at 808 a scanning process can comprise the X-Y-Z-R stage 414 performing a relatively serpentine motion. For example, in at least some embodiments, a Y-stage of the X-Y-Z-R stage 414 moves a substrate along a y-direction of the multi-stage SWIR TDI sensor 408 (e.g., the N-stages), while the multi-stage SWIR TDI sensor 408 shifts an image of the sample in synchrony. The Y-stage of the X-Y-Z-R stage 414 continues moving the substrate along the y-direction until an entire column of the substrate is scanned (see FIG. 6 column 1). Next, an X-stage of the X-Y-Z-R stage 414 is advanced by M-x pixels (see FIG. 6 col. 1 to col. 2, where x can be of the order of about 10 pixels). Next, the Y-stage will again scan the sample along a new column, but this time in the reverse direction (see FIG. 6 col. 2). The inventors have found that by repeating the scanning process, a user can attain a complete scan of the substrate in a relatively serpentine fashion.

In at least some embodiments, such as when a user has knowledge of a general position of fiducial marks (see FIG. 2 and FIG. 3, for example), covering the entire substrate may not be necessary. For example, at the end of a given swath (e.g., a column), the X-stage may be advanced to an x-coordinate position of a closest fiducial mark that is expected (or known) before the y-stage reengages as described above (e.g., skipping one or more x-coordinate positions before the y-stage reengages). Accordingly, by avoiding regions devoid of fiducial marks, a user can achieve a faster throughput.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present disclosure, other and further embodiments of the disclosure may be devised without departing from the basic scope thereof.

The invention claimed is:

1. An apparatus for detecting metrology data, comprising:
a substrate support configured to support a substrate and another substrate disposed on the substrate;
an incoherent light source configured to transmit an illumination beam through the substrate and the another substrate;
a set of optics configured to direct the illumination beam when transmitted through the substrate and the another substrate;
an actuator operably coupled to the substrate support and configured to move the substrate and another substrate back and forth in a scanning pattern; and
a sensor having a read-out rate, the sensor operably coupled to the actuator, the movement of the actuator synchronized with the read-out rate, the sensor configured to receive the illumination beam from the set of optics to obtain subsurface images of the substrate and the another substrate.

2. The apparatus of claim 1, wherein the another substrate is at least one of a coupon, wafer, or die.

3. The apparatus of claim 1, wherein the incoherent light source is an LED that is configured to generate light in a short wave infrared (SWIR) wavelength range.

4. The apparatus of claim 1, wherein the set of optics comprises at least one of a high-magnification microscope, an autofocus lens, a single resolution lens, or a tube lens.

5. The apparatus of claim 4, wherein the autofocus lens comprises an electrically tunable or acousto-optically modulated lens configured to focus at multiple depths through the substrate and the another substrate.

6. The apparatus of claim 1, wherein the set of optics is configured to provide magnifications from about 10× to about 100×.

7. The apparatus of claim 1, wherein the sensor is a multi-stage SWIR time-delay integration (TDI) sensor.

8. The apparatus of claim 1, wherein the actuator is configured to move the substrate and another substrate in a x-direction and a y-direction forming a relatively serpentine pattern.

9. The apparatus of claim 1, wherein the incoherent light source and the actuator are disposed in the substrate support.

10. The apparatus of claim 9, further comprising a transparent surface disposed on the substrate support and movable relative thereto, wherein the incoherent light source is positioned beneath the transparent surface and configured to deliver the illumination beam from a bottom-side of the substrate.

11. The apparatus of claim 1, wherein the incoherent light source is disposed between the set of optics and the sensor to deliver light directly to a top-side of the substrate and the another substrate.

12. The apparatus of claim 11, further comprising at least one of beam splitters, reflectors, or polarizers.

13. The apparatus of claim 1, wherein the movement of the actuator is synchronized with the read-out rate so that when the substrate support is moved by the actuator, a specific area of the substrate and the another substrate are exposed multiple times by the sensor, and wherein each exposure is averaged.

14. A method for packaging applications, comprising:
supporting a substrate and another substrate disposed on the substrate on a substrate support, the substrate support operably coupled to an actuator configured to move the substrate and the another substrate back and forth in a scanning pattern;
transmitting an illumination beam through the substrate and the another substrate;
directing the illumination beam when transmitted through the substrate and the another substrate;
moving the substrate and another substrate back and forth in a scanning pattern using the actuator; and
receiving, at a sensor, the illumination beam to obtain subsurface images of the substrate and the another substrate, the sensor having a read-out rate, the sensor operably coupled to the actuator, the movement of the actuator synchronized with the read-out rate.

15. The method of claim 14, wherein the another substrate is at least one of a coupon, wafer, or die.

16. The method of claim 14, wherein transmitting the illumination beam is performed using an LED that is configured to generate light in a short wave infrared (SWIR) wavelength range.

17. The method of claim 14, wherein directing the illumination beam is performed using a set of optics comprising at least one of a high-magnification microscope, an autofocus lens, a single resolution lens, or a tube lens.

18. The method of claim 17, wherein the autofocus lens comprises an electrically tunable or acousto-optically modulated lens configured to focus at multiple depths through the substrate and the another substrate.

19. The method of claim 17, wherein the set of optics is configured to provide magnifications from about 10× to about 100×.

20. The method of claim 14, wherein receiving the illumination beam is performed using a multi-stage SWIR time-delay integration (TDI) sensor.

21. A non-transitory computer readable storage medium have instructions stored thereon that when executed by a processor perform a method for packaging applications, comprising:
supporting a substrate and another substrate disposed on the substrate on a substrate support, the substrate support operably coupled to an actuator configured to move the substrate and the another substrate back and forth in a scanning pattern;
transmitting an illumination beam through the substrate and the another substrate;

directing the illumination beam when transmitted through the substrate and the another substrate;

moving the substrate and another substrate back and forth in a scanning pattern using the actuator; and receiving, at a sensor, the illumination beam to obtain subsurface images of the substrate and the another substrate, the sensor having a read-out rate, the sensor operably coupled to the actuator, the movement of the actuator synchronized with the read-out rate.

* * * * *